(12) United States Patent
Kita et al.

(10) Patent No.: US 8,545,979 B2
(45) Date of Patent: Oct. 1, 2013

(54) WAFER-PROCESSING TAPE AND METHOD OF PRODUCING THE SAME

(75) Inventors: Kenji Kita, Nisshin (JP); Yasumasa Morishima, Tokyo (JP); Shinichi Ishiwata, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 834 days.

(21) Appl. No.: 11/370,835

(22) Filed: Mar. 9, 2006

(65) Prior Publication Data

US 2006/0154066 A1 Jul. 13, 2006

Related U.S. Application Data

(63) Continuation of application No. PCT/JP2004/018524, filed on Dec. 6, 2004.

(30) Foreign Application Priority Data

Dec. 15, 2003 (JP) .................................. 2003-416640

(51) Int. Cl.
*B32B 7/12* (2006.01)
*B32B 7/10* (2006.01)

(52) U.S. Cl.
USPC ...... 428/354; 428/345; 428/343; 428/355 EP; 428/355 AC

(58) Field of Classification Search
None
See application file for complete search history.

(56) References Cited

U.S. PATENT DOCUMENTS

| 5,705,016 | A | * | 1/1998 | Senoo et al. ................... 156/289 |
| 5,827,609 | A | * | 10/1998 | Ercillo et al. .................. 428/354 |
| 5,888,606 | A | * | 3/1999 | Senoo et al. .................. 428/66.6 |
| 6,007,920 | A | * | 12/1999 | Umehara et al. ............ 428/473.5 |
| 6,042,922 | A | * | 3/2000 | Senoo et al. .................. 428/66.6 |
| 6,312,800 | B1 | * | 11/2001 | Noguchi et al. ............... 428/354 |
| 6,702,910 | B2 | * | 3/2004 | Noguchi et al. ................. 156/85 |
| 2005/0000638 | A1 | * | 1/2005 | Yamamoto ..................... 156/250 |
| 2005/0037542 | A1 | * | 2/2005 | Sato et al. ..................... 438/118 |
| 2005/0046042 | A1 | * | 3/2005 | Matsumura et al. .......... 257/782 |

FOREIGN PATENT DOCUMENTS

| JP | 2-32181 A | 2/1990 |
| JP | 8-53655 A | 2/1996 |

(Continued)

OTHER PUBLICATIONS

English Translation of JP 2003206457 A (2003).*

(Continued)

*Primary Examiner* — Callie Shosho
*Assistant Examiner* — Frank D Ducheneaux
(74) *Attorney, Agent, or Firm* — Birch, Stewart, Kolasch & Birch, LLP

(57) ABSTRACT

A wafer-processing tape, which has an adhesive layer and a removable adhesive layer formed on a surface of a base film, and which has an area where B>A, and an area where A>B, in which a peeling force between the base film and the adhesive layer is designated as A, and peeling forces between a target to be bonded and the adhesive layer and between a target to be bonded and the removable adhesive layer are designated as B, wherein the adhesive layer is transferred onto the chip side during pickup in the area where B>A, and the removable adhesive layer is not transferred onto the target to be bonded in the area where A>B during peeling off the tape.

5 Claims, 3 Drawing Sheets

(56) References Cited

FOREIGN PATENT DOCUMENTS

| | | | |
|---|---|---|---|
| JP | 10-335271 A | | 12/1998 |
| JP | 2003206457 A | * | 7/2003 |
| JP | 2004095844 A | * | 3/2004 |
| WO | WO 03016419 A1 | * | 2/2003 |

OTHER PUBLICATIONS http://www.merriam-webster.com/dictionary/laminate (2010).*
Humna translation of JP 1998-335271 A (1998).*
machine translation of JP 2004095844A (2004).*

* cited by examiner

WAFER-PROCESSING TAPE AND METHOD OF PRODUCING THE SAME

This application is a Continuation of copending PCT International Application No. PCT/JP2004/018524 filed on Dec. 6, 2004, which designated the United States, and on which priority is claimed under 35 U.S.C. §120. This application also claims priority under 35 U.S.C. §119(a) on Patent Application No(s). 2003-416640 filed in Japan on Dec. 15, 2003. The entire contents of each of the above documents is hereby incorporated by reference.

TECHNICAL FIELD

The present invention relates to a wafer-processing tape at least having an adhesive layer formed on a base film.

BACKGROUND ART

An assembling process of a semiconductor device, such as an IC or the like, comprises the steps of: cutting and separating (dicing) a semiconductor wafer and the like into respective chips, after patterning; mounting the chips on a substrate or the like; and sealing them with a resin or the like.

In the dicing step, a semiconductor wafer is adhered, and thus fixed, to a wafer-processing tape in advance, and then it is diced into the shape of chip. In the subsequent mounting step, the diced chip, having a removable adhesive or adhesion agent that is contained in a removable adhesive or adhesion layer separable from the base film, is peeled off (picked up) from the base film, and then fixed, for example, to a substrate by the removable adhesive or adhesion agent for adhering and fixing, which agent has adhered to the chip.

As the wafer-processing tape for use for the above purpose, use may be made of a tape having a removable adhesive layer and an adhesive layer laminated on a base film; a tape having an adhesive layer that also functions as a removable adhesive layer, i.e. a removable adhesive or adhesion agent layer, which layer is laminated on a base film, or the like. The removable adhesive layers that can be used for the above purposes include a usual pressure-sensitive adhesive-type, and a tape having a reduced adhesive or adhesion strength when it is hardened or cured by radiation, such as ultraviolet (UV) rays, electronic rays, and the like. Both of these types are required to have sufficient adhesive or adhesion strength so that the wafer is not peeled off from tape upon dicing, and they are also required to have peeling capability to be easily peeled off upon picking up.

Further, in the mounting step, sufficient adhesive force is required among the chips or between the chip(s) and the substrate. There are proposed a variety of wafer-processing tapes.

The wafer-processing tape that can be used in the steps above basically has an adhesive agent, a base film, and a separator; and, the adhesive strength (adhesive force) between the adhesive layer (or a removable adhesive or adhesion layer) and a removable adhesive layer (or the base film in the case of the above removable adhesive or adhesion layer) is usually designed to be extremely low, for the purpose of decreasing pickup errors in the pickup step above; and, the peeling force of the above layers is designed to be quite low enough for them to be easily peeled off. Further, the wafer-processing tape should be used by being adhered to the ring frame, during dicing; and, the tape should be peeled off from the ring frame, along with the adhesive agent (or the removable adhesive or adhesion agent), such that no adhesive is left thereon after use. However, the adhesive agent layer (or the removable adhesive or adhesion agent layer) is easily separated or peeled off from the removable adhesive agent layer (or the base film) by weak force, leaving the adhesive agent (or the removable adhesive or adhesion agent) adhered to the ring frame, i.e. adhesive residue.

As a result, in the wafer-processing tapes that can be used in such an application, the portion in contact with the ring frame demands special processing, such as alteration of the adhesive agent (or the removable adhesive or adhesion agent) or alteration of surface-modification conditions of the base film, and/or special tape structure, leading to technical complexity and consequently increased production cost.

To alter the adhesive agent (or the removable adhesive or adhesion agent) in the portion for the ring frame, it is necessary to laminate a tape accurately at a particular position after punching the portion for the ring frame out from the other portion.

Alternatively, it is proposed to eliminate the adhesive residue, by changing the peeling force between the adhesive layer (or the removable adhesive or adhesion layer) and the removable adhesive layer (or the base film) in the portion for the ring frame. The peeling force means the force required to peel the respective layers apart. Methods to control the surface energy of base film include modifying the surface by high-energy radiation, such as corona treatment, and providing a primer treatment on the film surface. Although the corona treatment is generally applicable to a wide variety of films independent of the kind of the base film, the boundary of the treated portion is not distinct, and thus, it is difficult to distinctly distinguish untreated and treated portions processed only by corona treatment.

On the other hand, in the primer treatment, it is necessary to select a suitable primer material according to the material of the base film to be used, and when a polyolefin-series film is used, it is generally difficult to keep the adhesive strength between the base film and the primer on a high level, often resulting in peeling-off between the primer layer and the base film when the wafer-processing tape is removed from the ring frame, and hence occurrence of adhesive residue on the ring frame.

To control the peeling force of the removable adhesive layer, it is necessary, for example, an additional step of altering the removable adhesive to be used, making the process very complicated.

Other and further features and advantages of the invention will appear more fully from the following description, taken in connection with the accompanying drawings.

DISCLOSURE OF THE INVENTION

Figure 1:
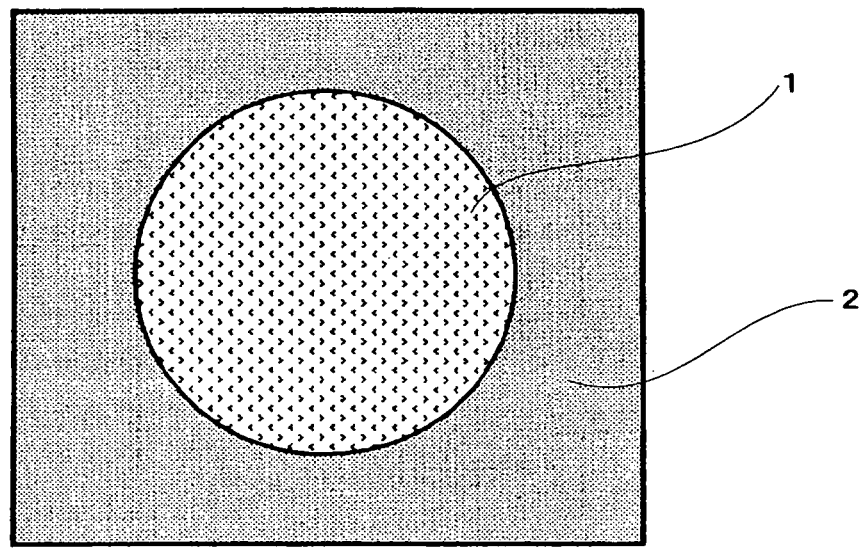
FIG. 1 is a plane view of the wafer-processing tape of Example 1, as seen from the wafer-adhering side.

According to the present invention, there is provided the following means:

(1) A wafer-processing tape, for example, for wafer-dicing and die bonding, having an adhesive layer and a removable adhesive layer formed at least on one side of a base film, said wafer-processing tape being usable in a bonding process comprising: adhering a wafer; dicing the wafer; and mounting a diced wafer onto a lead frame or semiconductor chip, in production of a semiconductor device, and said wafer-processing tape comprising:

an area having and an area not having the removable adhesive layer on a surface thereof to which the wafer is adhered, wherein the adhesive layer is transferred onto the chip side during pickup in the area not having the removable adhesive layer, and the adhesive layer remains on the base film side in the area having the removable adhesive layer during peeling off the tape;

(2) A wafer-processing tape, for example, for wafer-dicing and die bonding, having an adhesive layer and a removable adhesive layer formed at least on one side of a base film, said wafer-processing tape being usable in a bonding process comprising: adhering a wafer; dicing the wafer; and mounting a diced wafer onto a lead frame or semiconductor chip, in production of a semiconductor device, and said wafer-processing tape comprising:

an area where B>A; and an area where A>B in which a peeling force between the base film (or a layer provided on the base film) and the adhesive layer is designated as A, and peeling forces between a target to be bonded and the adhesive layer and between a target to be bonded and the removable adhesive layer are designated as B, wherein the adhesive layer is transferred onto the chip side during pickup in the area where B>A, and the removable adhesive layer is not transferred onto the target to be bonded in the area where A>B during peeling off the tape;

(3) The wafer-processing tape according to item (2), wherein said area where A>B is formed in a portion other than a portion to which the wafer is adhered;

(4) The wafer-processing tape according to item (2) or (3), wherein said area where A>B is colored;

(5) The wafer-processing tape according to item (1) or (2), having the adhesive layer formed at least on one side of the base film, said wafer-processing tape being usable in a bonding process comprising: adhering a wafer; dicing the wafer; and mounting a diced wafer onto a lead frame or semiconductor chip, in production of a semiconductor device, wherein said wafer-processing tape has the removable adhesive layer laminated on the adhesive layer in a portion other than a portion to which the wafer is adhered, and wherein the adhesive layer is transferred onto the chip side during pickup in the area not having the removable adhesive layer, and the laminated removable adhesive layer remains on the base film side during peeling off the tape;

(6) A wafer-processing tape, having an adhesive layer and a removable adhesive layer formed at least on one side of a base film, wherein the adhesive layer is directly disposed on a part of the removable adhesive layer and the wafer is directly disposed on a part of the adhesive layer, wherein the removable adhesive layer is directly disposed on the base film, said wafer-processing tape comprising:

an area where B3>A3; and an area where A4>B4 in which peeling forces between the removable adhesive layer and the adhesive layer disposed on the removable adhesive layer, and between the removable adhesive layer and the base film are designated as A3 and A4, respectively, and peeling forces between one target to be bonded and the adhesive layer and between another target to be bonded and the removable adhesive layer are designated as B3 and B4, respectively, wherein the adhesive layer is transferred onto a chip side upon pickup in the area where B3>A3, and the removable adhesive layer is not transferred onto the other target to be bonded, which is bonded to the removable adhesive layer, in the area where A4>B4 upon peeling off the tape, wherein the adhesive layer comprises an adhesive agent selected from the group consisting of an acrylic adhesive agent, blended adhesive agent of an epoxy resin/a phenol resin/an acrylic resin, an acrylic removable adhesive or adhesion agent and a blended removable adhesive or adhesion agent of an epoxy resin/an acrylic resin, wherein said wafer is said one target to be bonded.

Further, preferable examples of methods of providing the wafer-processing tape and of the wafer-processing tapes, include the followings:

(8) A method of producing a wafer-processing tape, comprising the steps of:

providing a tape (a) having an adhesive layer on a base film;

providing a tape (b) for use as a separator film having a removable adhesive layer formed in a given area thereof; and adhering directly the adhesive layer side of the tape (a) and the removable adhesive layer side of the tape (b), thereby producing a composite wafer-processing tape;

(9) The method of producing a wafer-processing tape according to item (8), wherein said tape (a) is provided with a removable adhesive layer and the adhesive layer formed on the base film in this order;

(10) A wafer-processing tape, which is produced by the method according to item (9), wherein the removable adhesive layer is transferred and adhered onto the adhesive layer side during peeling off said separator;

(11) A method of producing a wafer-processing tape, comprising the steps of:

providing a tape (c) having a removable adhesive layer on a base film;

providing a tape (d) for use as a separator film having an adhesive layer formed in a given area thereof; and adhering directly the removable adhesive layer side of the tape (c) and the adhesive layer side of the tape (d), thereby producing a composite wafer-processing tape;

(12) A wafer-processing tape, which is produced by the method according to item (11), wherein the adhesive layer is transferred and adhered onto the removable adhesive layer side during peeling off said separator; and

(13) The wafer-processing tape according to item (1), (2), (3), (4), (5), (6), (7), (10) or (12), wherein said adhesive layer is a removable adhesive or adhesion layer, which also has a removable adhesion function.

Herein, the term "adhesive layer" or "removable adhesive or adhesion layer" means a layer, which can be peeled off from the removable adhesive layer and remain adhered to a chip when a semiconductor wafer or the like is mounted and diced and then the chip is picked up, and which can be used as an adhesive when the chip is mounted on and fixed to a substrate or a lead frame.

Further, the term "removable adhesive layer" means a layer that has a lower peeling force with the target to be bonded than that of the adhesive layer, and that can be used for temporary adhesion. Further, the term "removable adhesive or adhesion agent" means an adhesive agent which normally has an adhesive property sufficient for use also for temporary adhesion, and which gains a strong adhesive strength to the target to be bonded particularly by stimulation such as heating or the like, and thus can function as a semipermanent adhesive agent.

Further, the term "peeling force" means a force needed for peeling the adhered surfaces apart, and can be determined according to the method as stipulated in JIS Z0237.

BEST MODE FOR CARRYING OUT THE INVENTION

The present invention is explained in detail below.

After intensive studies to solve the above problems in the conventional technique, the inventors have found that it is possible to prevent adhesive transfer onto the ring frame in the tape removal step after dicing, by considering the presence or absence of a removable adhesive layer and the respective peeling forces among the target to be bonded, the adhesive layer (or the removable adhesive or adhesion layer), and the base film, in the wafer-processing tape described above; and as a result, the inventors have succeeded in developing a wafer-processing tape without making the tape structure more complicated.

The wafer-processing tape of the present invention has an adhesive layer (or a removable adhesive or adhesion layer) and a removable adhesive layer formed on the surface of a base film, and generally has a separator as the outer layer laminated.

Any one of separators well-known in the art including a polyethylene terephthalate (PET)-based, a polyethylene-based, and other peel-apart treated films, may be used as the separator.

The adhesive agent for use in the wafer-processing tape of the present invention is not particularly limited, and may be any one of adhesives generally used in dicing and die-bonding tapes. Preferable examples of the adhesive agent include acrylic adhesives, blended adhesives of an epoxy resin/a phenol resin/an acrylic resin, and the like. The thickness of the adhesive agent layer may be determined arbitrarily, but is preferably about 5 to 100 μm.

When using a removable adhesive or adhesion agent, the removable adhesive or adhesion agent is also not particularly limited, and may be any one of the removable adhesive or adhesion agents generally used in dicing and die-bonding tapes. Preferable examples of the removable adhesive or adhesion agent include an acrylic removable adhesive or adhesion agent, a blended removable adhesive or adhesion agent of an epoxy resin/an acrylic resin, and the like. If the removable adhesive or adhesion agent is radiation (in particular, UV) curable, it is advantageous because the chipping during dicing is smaller.

The removable adhesive layer or the removable adhesive or adhesion agent layer may be formed on the both sides of the base film, and the thickness of each layer can be determined arbitrarily, but is preferably about 5 to 50 μm.

The base film that can be used in the wafer-processing tape of the present invention may be a film of any material having a radiation transmission ability. Examples of the film material include a homopolymer or copolymer of an α-olefin, e.g. polyethylene, polypropylene, an ethylene/propylene copolymer, polybuten, an ethylene/vinyl acetate copolymer, an ethylene/acrylate copolymer, or an ionomer; an engineering plastic, e.g. polyethylene terephthalate, a polycarbonate, or poly(methyl methacrylate); or a thermoplastic elastomer, e.g. polyurethane, a styrene/ethylene/buten or penten-series copolymer.

Alternately, the base film may be formed from a mixture of two or more kinds of materials selected from the above compound group; and the base film may be formed of a single layer, or double or higher layers of any material selected from the above compound group.

The thickness of the base film to be used is not particularly limited and can be determined arbitrarily, but is preferably 50 to 200 μm.

The organic compound for use in the removable adhesive layer for the wafer-processing tape of the present invention is not particularly limited, and can be selected from any resins for use as removable adhesives, e.g. chlorinated polypropylene resins, acrylic resins, polyester resins, polyurethane resins, and epoxy resins.

The removable adhesive agent is preferably prepared by blending, to the resin for a removable adhesive layer, an acrylic removable adhesive, a radiation-polymerizable compound, a photopolymerization initiator, a curing agent, and the like, in given amounts. The thickness of the removable adhesive layer is not particularly limited and may be determined arbitrarily, but is preferably 5 to 30 μm.

The radiation-polymerizable compound may be blended in the removable adhesive or adhesion layer or in the removable adhesive layer, or in both of the two layers. Further, as the above-mentioned radiation polymerizable compound, use can be made, for example, of any of low-molecular-mass compounds each having at least two photopolymerizable carbon-carbon double bonds in the molecule, which can exhibit a three-dimensional network by irradiation of light. More specifically, use can be made of, for example, trimethylolpropane triacrylate, pentaerythritol triacrylate, pentaerythritol tetraacrylate, dipentaerythritol monohydroxypentaacrylate, dipentaerythritol hexaacrylate, 1,4-butyleneglycol diacrylate, 1,6-hexanediole diacrylate, polyethylenegrycol diacrylate, and an origoester acrylate.

As well as the above acrylate-series compounds, an urethane acrylate-series oligomer can also be used. The urethane acrylate-series oligomer can be obtained, by reacting a terminal isocyanate urethaneprepolymer that can be obtained by reaction of a polyol compound, e.g. a polyester-type or polyether-type, and a polyisocyanate compound (for example, 2,4-tolylenediisocyanate, 2,6-tolylenediisocyanate, 1,3-xylilenediisocyanate, 1,4-xylilenediisocyanate, diphenylmethane-4,4-diisocyanate), with a methacrylate or acrylate having a hydroxyl group (for example, 2-hydroxyethyl acrylate, 2-hydroxyethyl methacrylate, 2-hydroxypropyl acrylate, 2-hydroxypropyl methacrylate, polyethyleneglycol acrylate, polyethyleneglycol methacrylate).

The removable adhesive layer may contain two or more resins selected from the resins above.

Further, when using a photo-polymerization initiator, use can be made, for example, of isopropyl benzoin ether, isobutyl benzoin ether, benzophenone, Michler's ketone, chlorothioxanthone, dodecyl thioxanthone, dimethyl thioxanthone, diethyl thioxanthone, benzyl dimethyl ketal, α-hydroxycyclohexyl phenyl ketone, 2-hydroxymethylphenylpropane, and the like. The amount of the photo polymerization initiator to be blended is preferably 0.01 to 5 mass parts, to 100 mass parts of the acrylic-series copolymer.

In one example, the wafer-processing tape having an adhesive layer and a removable adhesive layer on a base film surface according to the present invention, does not have the removable adhesive layer on the entire surface of the film to which a wafer is adhered, and instead, has the adhesive layer on the base film surface or a primer layer provided on the base film, and further has a removable adhesive layer only in the portion except the portion whereto is adhered the wafer that is one of the targets to be bonded. Accordingly, there are an area having and an area not having the removable adhesive layer, on the surface whereto the wafer is adhered. The peeling force A between the base film (or the layer provided on the base film) and the adhesive layer is made to be smaller than the peeling force B between the wafer and the adhesive layer. In addition, the removable adhesive agent has a smaller adhesive strength than the adhesive agent, and the peeling force B between the dicing ring frame and the removable adhesive layer is smaller than the peeling force A between the base film and the adhesive layer. In this way, there are provided the area where B>A and the area where A>B formed on the identical wafer-processing tape.

When the wafer-processing tape is used, the wafer is tightly bonded to the tape, allowing smooth dicing of the wafer, and when the resulting diced chip is picked up, peeling off occurs between the base film and the adhesive layer, transferring the adhesive layer to the chip side, since the peeling force A between the base film and the adhesive layer is smaller than the peeling force B between the wafer and the adhesive layer. During the subsequent tape peeling off, since the peeling force B between the dicing ring frame and the removable adhesive layer is smaller than the peeling force A between the base film and the adhesive layer, peeling off occurs between the dicing ring frame and the removable adhesive layer, leaving the removable adhesive layer as wall as the adhesive layer on the base film side, prohibiting transfer of the removable adhesive agent onto the dicing ring frame that is one of the targets to be bonded.

Because the area above where A>B is formed in the portion except the portion whereto the wafer is adhered, the wafer, which is positioned relative to the ring frame, is placed in a central circle in the frame, and thus the area where A>B, i.e. the area having the removable adhesive layer, is located in the area outside the central circle at the center portion of the tape corresponding thereto.

Further, the area where A>B may be colored, for making the area where A>B, i.e. the area having the removable adhesive agent, of the wafer-processing tape more recognizable mechanically. The dye to be added to the removable adhesive agent components for coloring is not particularly limited, but is preferably a dye transmitting UV light. Coloration as above enables easier identification of the area where A>B, making it further easier to position the wafer-processing tape of the present invention when using.

In another example of the wafer-processing tape of the present invention, the removable adhesive or adhesion layer is not formed on the entire surface of the wafer-processing tape whereto the wafer is adhered, and the removable adhesive layer is formed on the base film surface, and the adhesive layer is laminated in the portion whereto the wafer is adhered.

When the wafer-processing tape is used, the wafer is bonded to the tape tightly, allowing smooth dicing of the wafer. Because the peeling force between the removable adhesive layer and the adhesive layer is smaller than the peeling force between the wafer and the adhesive layer, peeling off occurs between the removable adhesive layer and the adhesive layer during pickup, transferring the adhesive layer onto the chip side. During the subsequent peeling off the tape, because the peeling force between the dicing ring frame and the removable adhesive layer is smaller than the peeling force between the base film and the removable adhesive layer, peeling off occurs between the dicing ring frame and the removable adhesive layer, prohibiting transfer of the removable adhesive agent onto the dicing ring frame.

Figure 4:
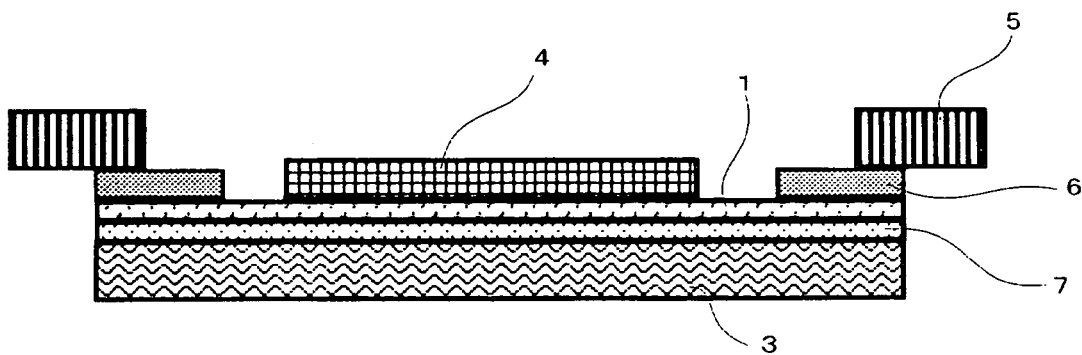
FIG. 4 is a cross-sectional view of the wafer-processing tape of Example 4, that is adhered to a wafer and a ring frame.

In still another example of the wafer-processing tape of the present invention and as shown in FIG. 4, a removable adhesive agent layer 7 and an adhesive layer 1 are laminated on a base film surface. A second removable adhesive layer 6 is formed only in the portion different from the portion whereto the wafer 4 is adhered. Accordingly, because the wafer 4, which is positioned relative to the ring frame 5, is placed in a central circle in the frame, the second removable adhesive layer 6 is formed in the portion outside a central circle at the center portion of the tape corresponding thereto, and the area having and the area not having the removable adhesive layer 6 are formed on the surface where the wafer 4 is mounted.

Further, the removable adhesive layer may be colored, for making the portion laminated and the portion not laminated thereon the removable adhesive on the wafer-processing tape (adhesive or adhesion tape) more recognizable mechanically. The dye to be added to the removable adhesive components for coloring is not particularly limited, but is preferably a dye transmitting UV light. Coloration as above enables easier identification of the area having and the area not having the removable adhesive layer, making it further easier to position the adhesive or adhesion tape of the present invention when using.

The present invention also relates to the method of producing the wafer-processing tape.

A tape (a) having an adhesive layer formed on a belt-shaped base film selected from the materials described above is prepared by any one of well-known methods including coating, spraying, and the like. Similarly, a tape (b) having a removable adhesive layer formed in a given area of a belt-shaped film for use as a separator is prepared. The given area above is preferably the area outside the circles each having a desirable diameter that are placed at an interval, and the circles, each of which has the center at the middle of the belt-like film in the transverse direction, are preferably placed at an equal interval. The adhesive layer side of the tape (a) and the removable adhesive layer side of the tape (b) thus prepared are directly bonded to each other, to give a composite wafer-processing tape.

When the above separator is peeled off, the removable adhesive layer is transferred and adhered onto the adhesive layer side.

In another producing method, a tape (c) having a removable adhesive layer formed on a belt-shaped base film is prepared in a similar manner to the producing process above. Separately, a tape (d) having an adhesive layer formed in a certain area of a belt-shaped film for use as a separator, is prepared, similarly. The certain area above is preferably the area outside the circles each having a desirable diameter that are placed at a given interval, and the circles, each of which has the center at the middle of the belt-like film in the transverse direction, are preferably placed at an equal interval. The removable adhesive layer side of the tape (c) and the adhesive layer side of the tape (d) thus prepared are directly bonded to each other, to give a composite wafer-processing tape.

When the above separator is peeled off, the adhesive layer is transferred and adhered onto the removable adhesive layer side.

In the description above, the wafer-processing tape having the adhesive layer and the removable adhesive layer formed on one face of the base film is described, but the present invention also include a double-faced wafer-processing tape that has a similar combination of the adhesive layer and the removable adhesive layer formed on both faces of the base film.

The wafer-processing tape of the present invention has a sufficiently high adhesive strength prohibiting peeling off the adhesive layer from the wafer and the removable adhesive layer from the ring frame during dicing; during pickup it allows tight adhering of the removable adhesive or adhesion layer and the backing surface of the diced chip, by radiation curing if needed, thereby it enables easier separation of the chip from the base film; and during tape removal it allows to peel off the tape from the ring frame without adhesive residue. Further, when a removable adhesive or adhesion agent is used as the adhesive agent, the chip may be picked up, after the removable adhesive or adhesion layer and the back surface of the chip are tightly bonded by radiation curing if needed during the pick up after dicing.

The wafer-processing tape of the present invention is preferable for dicing and die-bonding, since it has a sufficiently high adhesive strength not causing peeling off a wafer during dicing, it can be used as a dicing tape, and it can be used as an adhesive when the diced chips are mounted on a substrate or the like, without causing adhesive residue on the ring frame after the tape is peeled off with easy removal of the base film. Further, due to its simple structure, the wafer-processing tape can be provided in simple and low-cost production thereof, without causing blocking.

When the removable adhesive layer is colored, it becomes further easier to position the wafer on a suitable position of the wafer-processing tape.

EXAMPLES

The present invention will be described in more detail based on examples given below, but the invention is not meant to be limited by these.

In the following examples, the values of peeling force were measured, according to the method specified in JIS 20237. The term "part(s)" means a part(s) by mass.

Example 1

To a solvent of toluene 400 g, a mixed solution of n-butyl acrylate 128 g, 2-ethylhexyl acrylate 307 g, methyl methacrylate 67 g, methacrylic acid 1.5 g, and benzoylperoxide as a polymerization initiator was added, dropwise, in an appropriately adjusted addition rate, followed by reaction of these by appropriately adjusting a reaction temperature and a reaction time, to give a solution of a polymer compound (1) having a given functional group.

Then, to the thus-obtained solution, added were, dropwise, a compound (2) having a radiation-curable carbon-carbon double bond and a given functional group, which was 2.5 g of 2-hydroxyethyl methacrylate separately synthesized from methacrylic acid and ethylene glycol, and hydroquinone as a polymerization inhibitor, followed by reaction of these, to give a solution of a compound (A) having a radiation-curable carbon-carbon double bond. Then, to 100 mass parts of the compound (A) in the thus-obtained compound (A) solution, was added 1 mass part of a polyisocyanate (B) of Coronate L (trade name, manufactured by Nippon Polyurethane Industry), and thereto were added 0.5 part by mass of IRGACURE 184 (trade name, manufactured by Nippon Ciba Geigy) as a photopolymerization initiator, and 150 parts by mass of ethyl acetate as a solvent, followed by mixing the resultant solution, to prepare a radiation-curable removable adhesive agent.

The middle portion of a PET-series separator film with thickness 50 µm and width 300 mm, was coated, using a gravure coater, with the thus-obtained removable adhesive agent, in the portion outside a center circle with diameter 210 mm, as shown in FIG. 1. The thus-coated film was dried in a hot-air drying furnace, to give a PET film tape (b) having a removable adhesive layer 2 with thickness 10 µm after drying. In the actual production process, a patterned film having such circles provided continuously and repeatedly may be produced. Herein, in each figure, the identical reference numeral has the same meaning to represent the same member.

Then, a surface-unmodified polyolefin-series base film 3 with thickness 100 µm, was coated with a removable adhesive or adhesion agent obtained by blending the following components. The thus-coated film was dried under heating, to give a tape (a) provided a removable adhesive or adhesion agent layer 1 with thickness 25 µm.

Copolymer of methyl acrylate and glycidyl methacrylate (solid content: 35 mass %)
100 parts by mass
(in terms of mass of the solid)
Bisphenol-series glycidyl-type epoxy resin (number-average molecular weight: 500)
600 parts by mass
Photopolymerizable epoxy acrylate-series oligomer (a compound having two double bonds)
100 parts by mass
Photopolymerization initiator (2,2-dimethoxy-2-phenyl acetophenone)
5 parts by mass The thus-prepared removable adhesive or adhesion layer tape (a) and the PET film tape (b) were laminated, to give a wafer-processing tape, as shown in FIG. 1.

Formation of the removable adhesive layer 2 on a base and of the removable adhesive or adhesion layer 1 on another base different from the above one, makes coating of the removable adhesive agent to form the layer thereof on a specific area much easier, and it also allows separate drying of the removable adhesive or adhesion agent layer 1 and the removable adhesive layer 2, thereby resulting easier control of the product's quality.

Figure 2:
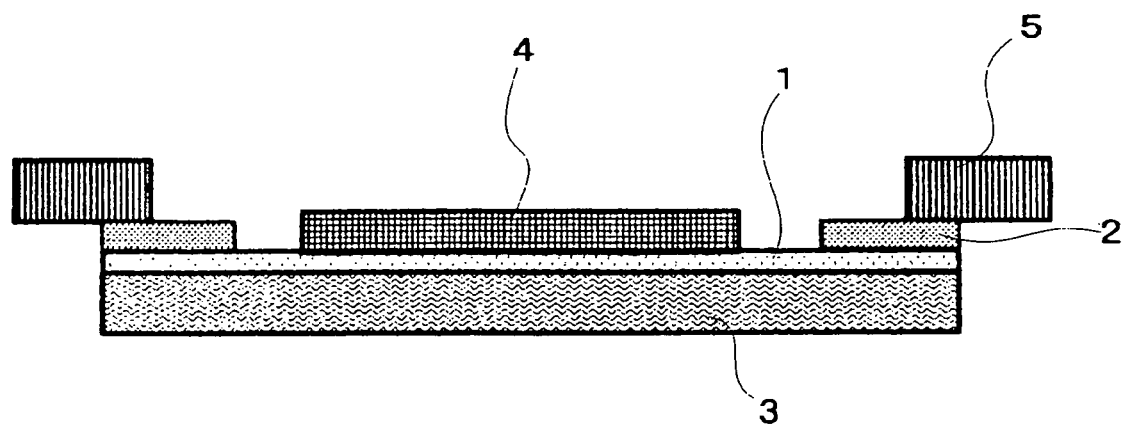
FIG. 2 is a cross-sectional view of the wafer-processing tape of Example 1, that is adhered to a wafer and a ring frame.

By using the wafer-processing tape, a silicon semiconductor wafer 4 of 8 inches (20.32 cm) in diameter, which is one target to be bonded, was mounted on a stainless steel ring frame 5 for dicing, which is the other target to be bonded, as shown in FIG. 2. At that time, the separator film was peeled off, the silicon semiconductor wafer 4 was adhered to a portion of the removable adhesive or adhesion layer 1, and the ring frame 5 for dicing was adhered to the portion to which the removable adhesive layer 2 was formed.

Then, after irradiation with ultraviolet light at 40 mW/cm$^2$ for 12 seconds from the base film 3 side, using a 80-W/cm high-pressure mercury lamp, the silicon wafer was diced into chips of 5 mm square; the chips were picked up by a pickup die bonder; and then the wafer-processing tape used was peeled off from the ring frame 5. It was confirmed that there was no adhesive (adhesive residue) remaining on the ring frame 5 in observation with the naked eye.

Although the removable adhesive layer 2 had an adhesive strength necessary for adhering the wafer-processing tape to the ring frame 5, the removable adhesive layer had adhesiveness weaker than the removable adhesive or adhesion layer 1, thus it was possible to peel the removable adhesive layer 2 off from the ring frame 5 with a peeling force (0.12 N/25 mm), which was weaker than a peeling force (0.30 N/25 mm) between the removable adhesive or adhesion layer 1 and the base film 3. Further, the chip of the silicon semiconductor wafer 4 and the removable adhesive or adhesion layer 1 were adhered so strongly that it was impossible to peel them apart. Accordingly, the wafer-processing tape was a wafer-processing tape having a removable adhesive layer 2 on the portion except that whereto the wafer 4 was adhered, i.e. on the portion whereto the ring frame 5 was adhered. When the peeling force between the base film 3 and the removable adhesive or adhesion layer 1 is designated as A and the peeling forces between the target to be bonded and the removable adhesive or adhesion layer 1 and between the target to be bonded and the removable adhesive layer 2 are designated as B, B was larger than A in the portion to which the wafer 4 was adhered, and A was larger than B in the portion to which the ring frame 5 was adhered. Thus, it was possible that during pickup, the removable adhesive or adhesion layer 1 was transferred onto the chip side, and the ring frame 5 did not have adhesive residue during tape peeling off.

Example 2

A wafer-processing tape was prepared in the same manner as in Example 1 by using the materials and the preparation method similar to Example 1, except that the removable adhesive layer 2 was prepared from a material in which the removable adhesive components of Example 1 was added with 0.5 parts by mass of a coloring agent (Kayaset Blue N (trade name), manufactured by Nippon Kayaku).

By using the wafer-processing tape, a silicon wafer of 8 inches (20.32 cm) in diameter was mounted on a stainless steel ring frame in the same manner as in Example 1. During the mounting, the portion having the removable adhesive layer 2 in the wafer-processing tape was colored, allowing the mounting process to be carried out easily and assuredly. Then, after the silicon wafer was diced; the chips were picked up; and the wafer-processing tape used was peeled off from the ring frame 5. It was confirmed that there was no adhesive residue on the ring frame 5 in observation with the naked eye. At that time, the peeling force between the removable adhesive layer 2 and the ring frame 5 was 0.12 N/25 mm, the peeling force between the removable adhesive or adhesion layer 1 and the base film 3 was 0.30 N/25 mm, and the chip of the silicon semiconductor wafer 4 and the removable adhesive or adhesion layer 1 were adhered so strongly that it was impossible to peel them apart.

Example 3

The wafer-processing tape of Example 3 was prepared, using the base film, the removable adhesive agent, the removable adhesive or adhesion agent, and the separator film similar to those in Example 1. However, the wafer-processing tape in Example 1 had the structure of the base film 3, the removable adhesive or adhesion layer 1, the removable adhesive layer 2, and the separator film in that order, but the wafer-processing tape in Example 3 had the structure of the base film 3, the removable adhesive layer 2, the removable adhesive or adhesion layer 1, and the separator film in that order.

That is, a removable adhesive layer tape (c) having a removable adhesive layer 2 with thickness 5 μm was obtained, by preparing a composition obtained by blending the removable adhesive components similar to those of Example 1, applying the composition onto a corona-treated polyolefin-series base film of thickness 100 μm, and drying the coated film under heating.

Then, the middle portion of a PET-series separator film with thickness 50 μm and width 300 mm, was coated, using a gravure coater, with the composition obtained by blending the removable adhesive or adhesion agent components similar to those in Example 1, in a circle with diameter 210 mm. The thus-coated film was dried in a hot-air drying furnace, to give a PET film tape (d) having a removable adhesive or adhesion layer 1 with thickness 10 μm after drying.

The thus-prepared removable adhesive layer tape (c) and the PET film tape (d) were laminated, to give a wafer-processing tape.

Figure 3:
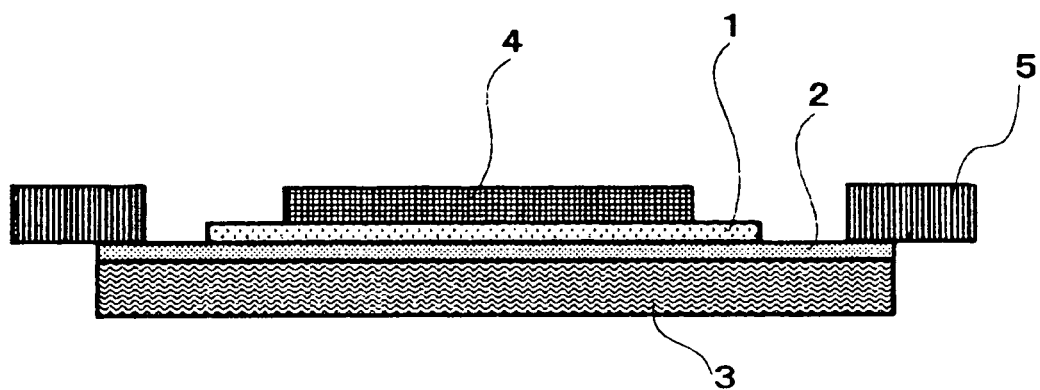
FIG. 3 is a cross-sectional view of the wafer-processing tape of Example 3, that is adhered to a wafer and a ring frame.

By using the wafer-processing tape, a silicon semiconductor wafer 4 of 8 inches (20.32 cm) in diameter was mounted on a stainless steel ring frame 5 for dicing in the same manner as in Example 1, as shown in FIG. 3. Then, after dicing, and picking-up the chips, the wafer-processing tape used was peeled off from the ring frame 5 in the same manner as in Example 1. It was confirmed that there was no adhesive residue on the ring frame 5 in observation with the naked eye. At that time, the peeling force between the removable adhesive layer 2 and the ring frame 5 was 0.12 N/25 mm, the peeling force between the removable adhesive or adhesion layer 1 and the removable adhesive layer 2 was 0.21 N/25 mm, and the chip of the silicon semiconductor wafer 4 and the removable adhesive or adhesion layer 1 were adhered so strongly that it was impossible to peel them apart.

Example 4

In the same manner as in Example 1, the middle portion of a PET-series separator film with thickness 50 μm and width 300 mm, was coated, using a gravure coater, with the removable adhesive agent, in the portion outside a center circle with diameter 210 mm, as shown in FIG. 1. The thus-coated film was dried in a hot-air drying furnace, to give a PET film tape (b) having a second removable adhesive layer 6 with thickness 10 μm after drying. In the actual production process, a patterned film having such circles provided continuously and repeatedly may be produced.

Then, a surface-unmodified polyolefin-series base film 3 with thickness 100 μm, was coated with a composition obtained by blending the following components.

The thus-coated film was dried under heating, to give a tape (e) provided a removable adhesive agent layer 7 with thickness 10 μm.

Acrylic acid ester copolymer having a radiation-polymerizable functional group (solid content: 35 mass %)
100 parts by mass
(in terms of mass of the solid)
Photopolymerizable epoxy acrylate-series oligomer (a compound having two double bonds)
100 parts by mass
Photopolymerization initiator (2,2-dimethoxy-2-phenyl acetophenone)
5 parts by mass Then, the tape (e) was coated with the removable adhesive or adhesion agent obtained in the same manner as in Example 1. The thus-coated film was dried under heating, to give a tape (f) provided a removable adhesive or adhesion agent layer 1 with thickness 25 μm. The thus-prepared tape (f) and the PET film tape (b) were laminated, to give a wafer-processing tape. By using the wafer-processing tape, a silicon semiconductor wafer 4 of 8 inches (20.32 cm) in diameter was mounted on a stainless steel ring frame 5 for dicing, as shown in FIG. 4. At that time, the peeling force between the second removable adhesive layer 6 and the ring frame 5 was 0.12 N/25 mm, the peeling force between the removable adhesive or adhesion layer 1 and the removable adhesive agent layer 7 was 0.14 N/25 mm, and the chip of the silicon semiconductor wafer 4 and the removable adhesive or adhesion layer 1 were adhered so strongly that it was impossible to peel them apart.

Formation of the removable adhesive layer 6 on a base and of the removable adhesive or adhesion layer 1 on another base different from the above one, makes coating of the removable adhesive agent to form the layer thereof on a specific area much easier, and it also allows separate drying of the removable adhesive or adhesion agent layer 1 and the removable adhesive layer 6, thereby resulting easier control of the product's quality.

Example 5

A removable adhesive layer tape (c) having a removable adhesive layer 2 with thickness 5 μm was obtained, by preparing a composition obtained by blending the removable adhesive components similar to those of Example 1, applying the composition onto a corona-treated polyolefin-series base film 3 of thickness 100 μm, and drying the coated film under heating.

Then, an adhesive layer 1 was formed on a separator film as described below.

To a composition of an epoxy resin of 50 parts by mass of a cresol novolac-type epoxy resin (epoxy equivalence: 197, molecular weight: 1,200, and softening point: 70° C.), 1.5 parts by mass of γ-mercaptopropyltrimethoxysilane and 3 parts by mass of γ-ureidopropyltriethoxysilane, as silane-coupling agents, and 30 parts by mass of silica filler having an average particle diameter of 16 nm, was added cyclohexanone, and the resultant mixture was stirred and mixed, and further kneaded in a bead mill for 90 minutes.

To the resultant mixture, added were 100 parts by mass of an acrylic resin (mass-average molecular weight: 800,000, and glass transition temperature: −17° C.), 5 parts of dipentaerythritol hexaacrylate as a hexa-functional acrylate monomer, 0.5 parts of an adduct of hexamethylene diisocyanate as a curing agent, and 2.5 parts of Curezole 2PZ (2-phenylimidazole, trade name, manufactured by Shikoku Corp.), and the mixture was stirred and mixed, followed by deaeration under vacuum, to give an adhesive agent.

With the thus-obtained adhesive agent, applied was a polyethylene terephthalate (PET) film 3 of thickness 25 μm that was previously release processed. The thus-coated film was dried at 110° C. for 1 minute under heating, to give a PET film tape (g) having an adhesive layer 1, which was the coating layer formed in the circular shape of diameter 210 mm and film thickness 40 μm in the B stage state.

The thus-prepared removable adhesive layer tape (c) and the PET film tape (g) were laminated, to give a tape for wafer processing.

By using the wafer-processing tape, a silicon semiconductor wafer 4 of 8 inches (20.32 cm) in diameter was mounted on a stainless steel ring frame 5 for dicing in the same manner as in Example 1, as shown in FIG. 3. Then, after dicing, and picking-up the chips, the wafer-processing tape used was peeled off from the ring frame 5 in the same manner as in Example 1. It was confirmed that there was no adhesive residue on the ring frame 5 in observation with the naked eye. At that time, the peeling force between the removable adhesive layer 2 and the ring frame 5 was 0.12 N/25 mm, the peeling force between the adhesive layer 1 and the removable adhesive layer 2 was 0.13 N/25 mm, and the chip of the silicon semiconductor wafer 4 and the adhesive layer 1 were adhered so strongly that it was impossible to peel them apart.

This Example 5 utilized the structure of Example 3, except that the adhesive was used instead of the removable adhesive or adhesion agent to be used in Example 3.

Herein, the adhesive agent to form the adhesive layer is not particularly limited, and may be any one of film-shaped adhesives generally used in dicing and die-bonding tapes. Preferable examples of the adhesive agent include acrylic adhesives, blended adhesives of epoxy/phenol/acrylic resins, and the like. The thickness of the adhesive layer may be set arbitrarily, but is preferably about 5 to 100 μm.

Figure 5:
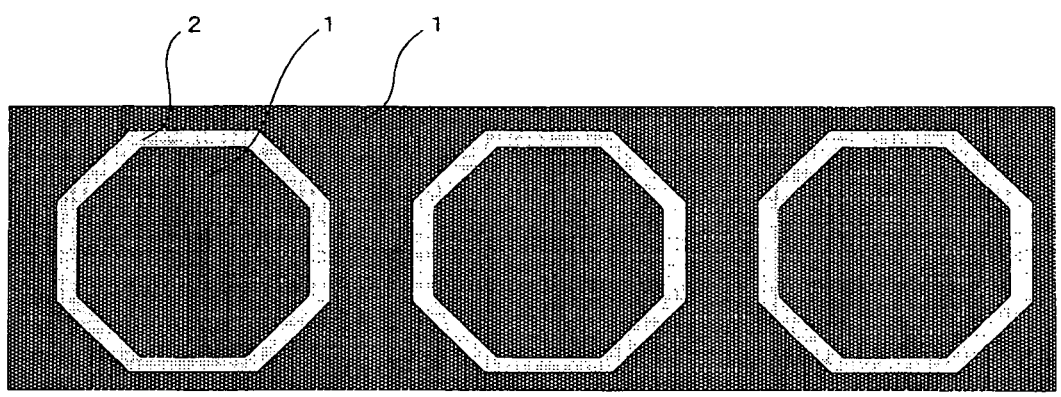
FIG. 5 is a plane view illustrating a PET film tape provided with an adhesive layer in the pattern in which the portions corresponding to those where the ring frame is to be adhered are punched out repeatedly in the octagonal shape.

In this Example, the shape of the adhesive layer onto which surface the wafer was adhered, was formed in the shape of a circle of diameter 21 cm, to the circular wafer shape (diameter: 20.32 cm). However, the adhesive layer shape is not limited to this, as long as there are an adhesive layer on the portion whereto the wafer is adhered and a removable adhesive layer on the portion whereto the ring frame is adhered, and thus the adhesive layer may be, for example, polygonal in shape. Further, instead of the PET film tape (g) having an adhesive layer being prepared, a PET film tape (g') having no adhesive layer in the portion corresponding to those whereto the ring frame is adhered, may be produced and used, for example, by forming an adhesive layer uniformly over the PET film tape and punching the adhesive layer out repeatedly. For example, as shown in FIG. 5, a PET film tape provided with an adhesive layer in a pattern in which the portion corresponding to those whereto the ring frame is adhered are punched out repeatedly in the octagonal form, may be used.

Comparative Example 1

A wafer-processing tape was prepared in the same manner as in Example 1, except for using a PET film (50 μm in thickness, and 300 mm in width) similar to that in Example 1 but having no removable adhesive layer, instead of the PET film tape (b) on which the removable adhesive agent was coated as described in Example 1.

In the same manner as in Example 1, the thus-obtained wafer-processing tape was used, and the peeling property thereof from the ring frame after use was tested and evaluated, revealing that the removable adhesive or adhesion agent peeled off from the base film was still adhered onto the ring frame. At that time, the removable adhesive or adhesion layer and the ring frame were adhered so strongly that it was impossible to peel them apart. The peeling force between the removable adhesive or adhesion layer and the base film was 0.30 N/25 mm. The chip of the silicon semiconductor wafer and the removable adhesive or adhesion layer were adhered so strongly that it was impossible to peel them apart.

INDUSTRIAL APPLICABILITY

The wafer-processing tape of the present invention can be preferably utilized in the adhesion process of adhering a wafer or the like, dicing the wafer, and mounting the resultant diced wafer onto a lead frame or a semiconductor chip, in production of semiconductor devices, such as silicon wafers.

Having described our invention as related to the present embodiments, it is our intention that the invention not be limited by any of the details of the description, unless otherwise specified, but rather be construed broadly within its spirit and scope as set out in the accompanying claims.

The invention claimed is:

1. A wafer-processing tape, having an adhesive layer and a removable adhesive layer formed at least on one side of a base film, wherein the adhesive layer and the base film are formed of a single layer, wherein the removable adhesive layer is directly disposed on a part of the adhesive layer different from a portion whereto a wafer is to be adhered, wherein the adhesive layer is directly disposed on the base film, said wafer-processing tape comprising:
an area where B1>A; and
an area where A>B2 in which a peeling force between the base film and the adhesive layer disposed on the base film is designated as A, and peeling forces between one target to be bonded and the adhesive layer and between another target to be bonded and the removable adhesive layer are designated as B1 and B2, respectively, wherein the adhesive layer is transferred onto a chip side upon pickup in the area where B1>A, and the removable adhesive layer is not transferred onto the other target to be bonded, which is bonded to the removable adhesive layer, in the area where A>B2 upon peeling off the tape; wherein said wafer is said one target to be bonded.

2. The wafer-processing tape according to claim 1, wherein said area where A>B2 is formed in a portion other than a portion to which a wafer is to be adhered.

3. The wafer-processing tape according to claim 1 or 2, wherein said area where A>B2 is colored.

4. The wafer-processing tape according to claim 1, wherein said adhesive layer is a removable adhesive or adhesion layer which has a removable adhesion property.

5. The wafer-processing tape according to claim 1, wherein said removable adhesive layer contains a removable adhesive agent, the removable adhesive agent being a compound having a radiation-curable carbon-carbon double bond which is a reaction product of 2-hydroxyethyl methacrylate with a polymer compound having a functional group prepared by reaction of n-butyl acrylate, 2-ethylhexyl acrylate, methyl methacrylate, and methacrylic acid.

* * * * *